(12) United States Patent
Hirata

(10) Patent No.: US 9,431,852 B2
(45) Date of Patent: Aug. 30, 2016

(54) POWER SUPPLY DEVICE

(71) Applicant: SUMITOMO HEAVY INDUSTRIES, LTD., Tokyo (JP)

(72) Inventor: Kazuhiro Hirata, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 401 days.

(21) Appl. No.: 14/013,167

(22) Filed: Aug. 29, 2013

(65) Prior Publication Data

US 2014/0062203 A1   Mar. 6, 2014

(30) Foreign Application Priority Data

Sep. 6, 2012  (JP) ................................ 2012-196295
Sep. 6, 2012  (JP) ................................ 2012-196297

(51) Int. Cl.
*H02J 7/00* (2006.01)
*H02J 9/00* (2006.01)
*H02J 9/06* (2006.01)
*H02J 7/34* (2006.01)
(Continued)

(52) U.S. Cl.
CPC ................. *H02J 9/061* (2013.01); *H02J 7/34* (2013.01); *G01R 31/362* (2013.01); *H01M 12/06* (2013.01); *Y10T 307/625* (2015.04)

(58) Field of Classification Search
CPC ........ H02J 9/061; H02J 7/34; Y10T 307/625
USPC ........... 307/43, 64, 65, 66; 429/17, 403, 405
See application file for complete search history.

(56) References Cited

U.S. PATENT DOCUMENTS 5,208,526 A *  5/1993  Goldman ............... H01M 4/02
                                                    320/128
2001/0002772 A1   6/2001  Kim et al.
2003/0231003 A1  12/2003  Ballard et al.
(Continued)

FOREIGN PATENT DOCUMENTS

| CN | 102148531 A | * | 8/2011 | ............... H02J 9/06 |
| CN | 102593907 A | | 7/2012 | |
| CN | 102593941 A | | 7/2012 | |
| EP | 2 523 306 A1 | | 11/2012 | |
| JP | 08-129436 A | | 5/1996 | |

(Continued)

OTHER PUBLICATIONS

European Search Report application No. 13020085.0 dated Oct. 2, 2014.

(Continued)

*Primary Examiner* — Rexford Barnie
*Assistant Examiner* — Rasem Mourad
(74) *Attorney, Agent, or Firm* — Squire Patton Boggs (US) LLP

(57) ABSTRACT

A power supply device includes an input terminal to which an electric power is supplied from a commercial power source; an output terminal connected to an electric load; a power storage device to be charged by the electric power supplied from the input terminal and supplying the electric power to the output terminal; a primary battery; and a controller supplying an output of the primary battery to the output terminal, when monitoring a voltage of the commercial power source, which is applied to the input terminal, and a charged state of the power storage device, and detecting that the voltage of the commercial power source falls to a specified voltage value or less and the charged state of the power storage device indicates a specified value or less.

6 Claims, 13 Drawing Sheets

(51) Int. Cl.
*G01R 31/36* (2006.01)
*H01M 12/06* (2006.01)

(56) References Cited

U.S. PATENT DOCUMENTS

| | | | |
|---|---|---|---|
| 2004/0224195 A1* | 11/2004 | Huang | H01M 10/42 429/406 |
| 2005/0105229 A1 | 5/2005 | Deng et al. | |
| 2005/0225914 A1 | 10/2005 | King | |
| 2011/0140649 A1* | 6/2011 | Choi | H01M 14/005 320/101 |
| 2012/0293002 A1* | 11/2012 | Ye | H02J 9/06 307/66 |
| 2013/0221896 A1 | 8/2013 | Dong | |

FOREIGN PATENT DOCUMENTS

| | | |
|---|---|---|
| JP | 8-154344 A | 6/1996 |
| JP | 2004-032881 A | 1/2004 |
| JP | 2007-189813 A | 7/2007 |
| JP | 2008-535156 A | 8/2008 |
| JP | 2009-55701 A | 3/2009 |
| JP | 2009-089454 A | 4/2009 |
| JP | 2011-024322 A | 2/2011 |

OTHER PUBLICATIONS

Japanese Office Action (Notice of Reasons of Rejection) application No. 2012-196295 mailed Nov. 10, 2015.
Japanese Office Action (Notice of Reasons of Rejection) application No. 2012-196297 mailed Nov. 10, 2015.

* cited by examiner

TIME t0 – t2

POWER SUPPLY DEVICE

RELATED APPLICATION

Priority is claimed to Japanese Patent Application No. 2012-196295, filed Sep. 6, 2012, and Japanese Patent Application No. 2012-196297, filed Sep. 6, 2012, the entire contents of which are incorporated herein reference.

BACKGROUND

1. Technical Field

The present invention relates to a power supply device which can supply an electric power to an electric load even if power supply is stopped from a commercial power source.

2. Description of Related Art

As a backup power source during a power failure, a secondary battery such as a lead storage battery has been used. In addition, Japanese Unexamined Patent Application Publication No. 2007-189813 discloses the backup power source which supplies a receiver with the sum of electrical energies from at least two or more dry-cell battery systems when a commercial power source is not available.

SUMMARY

According to an embodiment of the present invention, there is provided a power supply device including an input terminal to which an electric power is supplied from a commercial power source; an output terminal connected to an electric load; a power storage device to be charged by the electric power supplied from the input terminal and supplying the electric power to the output terminal; a primary battery; and a controller supplying an output of the primary battery to the output terminal, when monitoring a voltage of the commercial power source, which is applied to the input terminal, and a charged state of the power storage device, and detecting that the voltage of the commercial power source falls to a specified voltage value or less and the charged state of the power storage device indicates a specified value or less.

As a backup power source, the primary battery is arranged in addition to the power storage device. Thus, as compared to a case where the backup power source is configured to have only the power storage device, capacity of the power storage device can be decreased. Since the capacity of the power storage device is decreased, even if the power storage device is maintained in a fully charged state, power consumption caused by self-discharge is decreased. Accordingly, it is possible to reduce unnecessary power consumption.

DETAILED DESCRIPTION

When a secondary battery such as a lead storage battery is used as a backup power source, the secondary battery is maintained in a fully charged state for a certain period when an electric power is normally supplied from a commercial power source. If the secondary battery is maintained in the fully charged state, even for a certain period when the secondary battery is not in use, the electric power is unnecessarily consumed due to self-discharge. Furthermore, if the secondary battery is maintained in the fully charged state, the secondary battery continues to deteriorate. Thus, it is necessary to replace the secondary battery routinely.

When using a dry battery for the backup power source, in some cases, the remaining amount of the dry battery may be decreased due to the self-discharge. If the remaining amount of the dry battery is decreased, a disadvantageous situation may be encountered in that the dry battery cannot operate for an initial targeted operation time. In order to guarantee the rated operation time, it is necessary to replace the dry battery routinely.

There is a need for providing a power supply device which can decrease unnecessary power consumption caused by self-discharge of the secondary battery.

Figure 1:
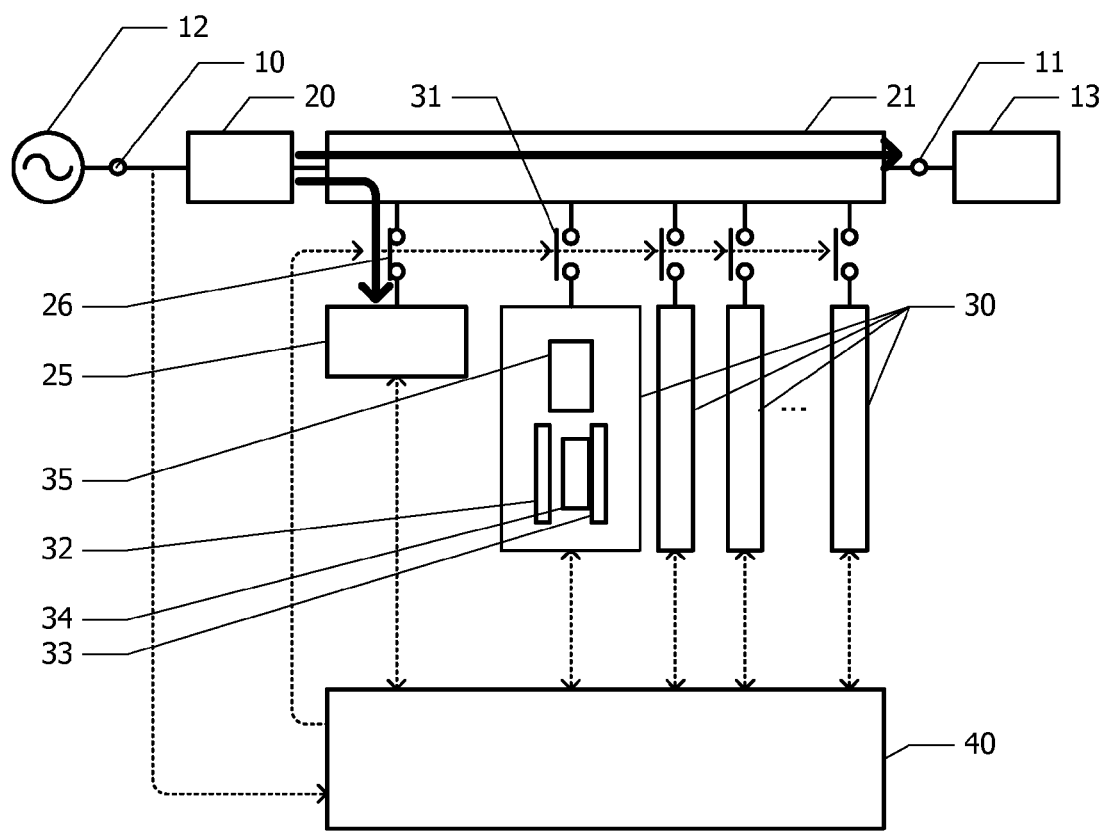
FIG. 1 is a block diagram of a power supply device according to one embodiment.

FIG. 1 illustrates a block diagram of a power supply device according to one embodiment. An AC power is supplied from a commercial power source 12 to an input terminal 10. An electric load 13 is connected to an output terminal 11. The electric load 13 is, for example, a transceiver of a radio base station on a mobile communication network. An AC-DC converter 20 converts the AC power input to the input terminal 10 to a DC power. The DC power is output to the output terminal 11 via an electric power transmission circuit 21, and is supplied to a power storage device 25 via the electric power transmission circuit 21 and a switching element 26. This allows the power storage device 25 to be maintained in a fully charged state at all times. For the power storage device 25, for example, a lead storage battery, a lithium ion secondary battery or a lithium ion capacitor may be used.

Multiple primary batteries 30 are connected to the electric power transmission circuit 21 via respectively associated switching elements 31. For the primary batteries 30, a metal-air battery, for example, such as a zinc air battery, an aluminum air battery and a magnesium air battery may be used.

Each of the primary batteries 30 includes a positive electrode current collector 32, a negative electrode current collector 33, a negative electrode active material 34 and an electrolytic solution 35. During the standby, the electrolytic solution 35 is separated from the negative electrode active material 34. A state where the electrolytic solution 35 is separated from the negative electrode active material 34 is referred to as a "standby state". If the electrolytic solution 35 is brought into contact with the negative electrode active material 34, an electromotive force is generated. A state where the electrolytic solution 35 comes into contact with the negative electrode active material 34 and the electromotive force is generated is referred to as an "operation state".

Measurement values of a voltage applied to the input terminal 10, a voltage across terminals of the power storage device 25, and a voltage across terminals of each of the multiple primary batteries 30 are input to a controller 40. Based on the input measurement values of the voltages, the controller 40 performs an on-off control of switching elements 26 and 31, and a switching control from the standby state to the operation state of the primary batteries 30.

Figure 2:
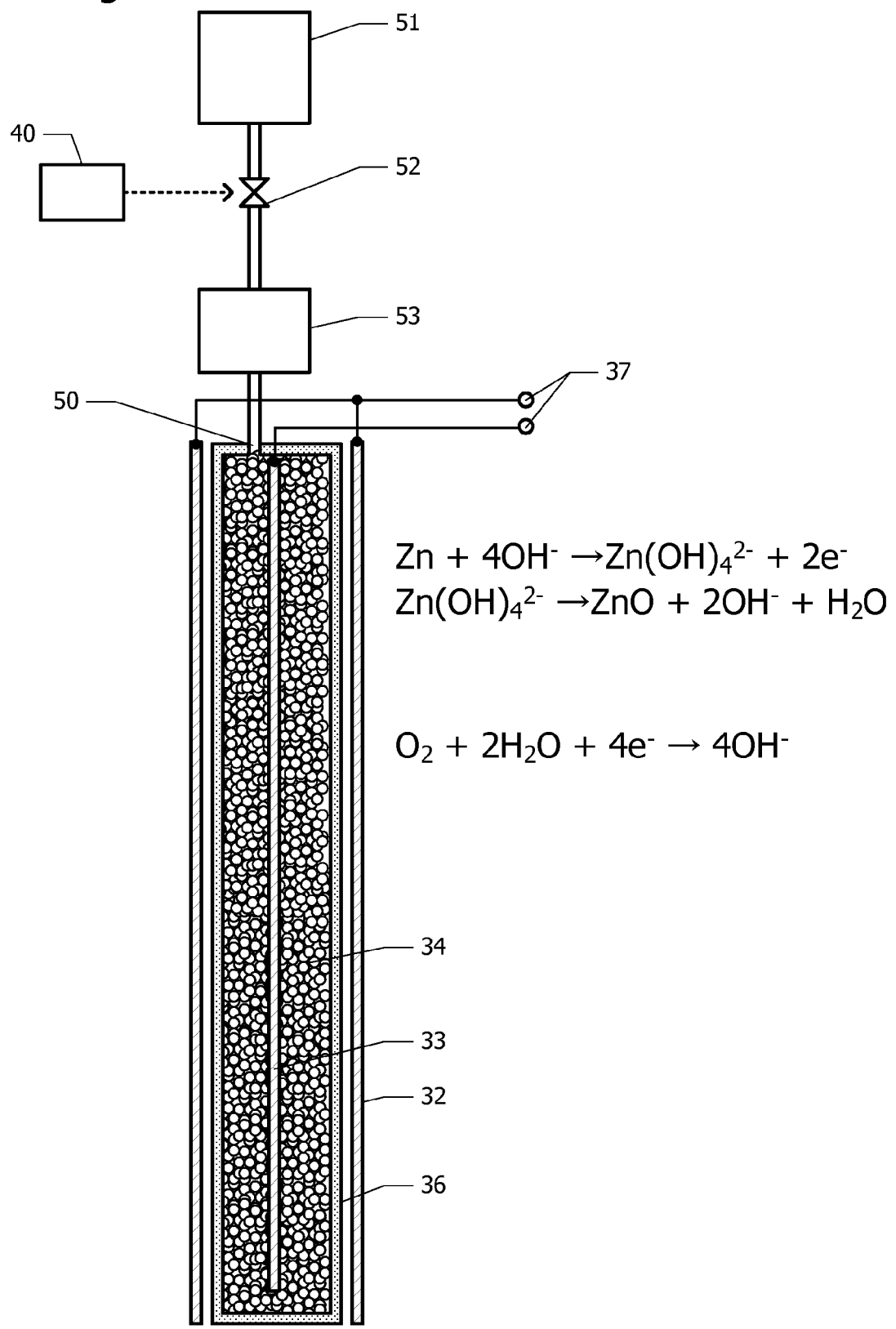
FIG. 2 is a cross-sectional view of a primary battery used in the power supply device according to one embodiment.

FIG. 2 illustrates a cross-sectional view of the primary battery 30 (refer to FIG. 1) which is used in the power supply device according to the embodiment. The inside of a pouch-shaped separator 36 is filled with the negative electrode current collector 33 and the negative electrode active material 34. For the negative electrode active material 34, for example, metal particles made of metallic zinc, metallic aluminum and metallic magnesium may be used. For the negative electrode current collector 33, for example, a metal plate made of nickel may be used. For the separator 36, for example, a porous membrane made of polyethylene or polypropylene, nonwoven fabric made of resin, or nonwoven fabric made of glass fiber is used.

The positive electrode current collector 32 adheres to an outer side surface of the separator 36. The positive electrode current collector 32 has a structure where a conductive material such as carbon black is coated on a base such as carbon cloth, carbon paper or the like. The conductive material includes a catalyst and an adhesive. For the catalyst, for example, manganese dioxide may be used. For the adhesive, for example, polyvinylidene fluoride may be used. The positive electrode current collector 32 has multiple fine apertures allowing oxygen to pass therethrough. The oxygen in the atmosphere acts as a positive electrode active material. The negative electrode current collector 33 and the positive electrode current collector 32 are connected to the output terminals 37 of the primary battery 30.

A solvent is accumulated inside the reservoir tank 51. The reservoir tank 51 is connected to an electrolyte containing chamber 53 via an on-off valve 52. Crystals of electrolyte are contained inside the electrolyte containing chamber 53. The on-off valve 52 is controlled by the controller 40. If the on-off valve 52 is turned on, the solvent inside the reservoir tank 51 is injected into the electrolyte containing chamber 53. The crystals of the electrolyte contained inside the electrolyte containing chamber 53 are dissolved in the solvent to generate the electrolytic solution. The generated electrolytic solution is injected to a space inside the separator 36 through an electrolytic solution injection port 50 provided on the separator 36. As an example, water may be used for the solvent, and potassium hydroxide (KOH) may be used for the electrolyte. In this case, aqueous potassium hydroxide solution is injected into the separator 36, as the electrolyte. The electrolytic solution may be contained in the reservoir tank 51 to omit the electrolyte containing chamber 53.

If the electrolytic solution is injected into the separator 36, zinc (Zn) of the negative electrode active material 34 and hydroxide ions (OH$^-$) in the electrolytic solution react to generate tetra hydroxonium zincate ($Zn(OH)_4^{2-}$) and electrons. The tetra hydroxonium zincate is decomposed to generate zinc oxide (ZnO), hydroxide ions and the water. The generated electrons are collected in the negative electrode current collector 33. If the electric load is connected across the output terminals 37, the electrons collected in the negative electrode current collector 33 are supplied to the positive electrode current collector 32 through the electric load.

The oxygen serving as the positive electrode active material, the electrons supplied to the positive electrode current collector 32 and the water react to generate the hydroxide ions. The hydroxide ions are transported through the separator 36 to reach the negative electrode active material 34. As described above, if the metal-air battery discharges the electricity, the negative electrode active material 34 is oxidized, and the metal oxide, for example, zinc oxide, is accumulated.

Figure 3:
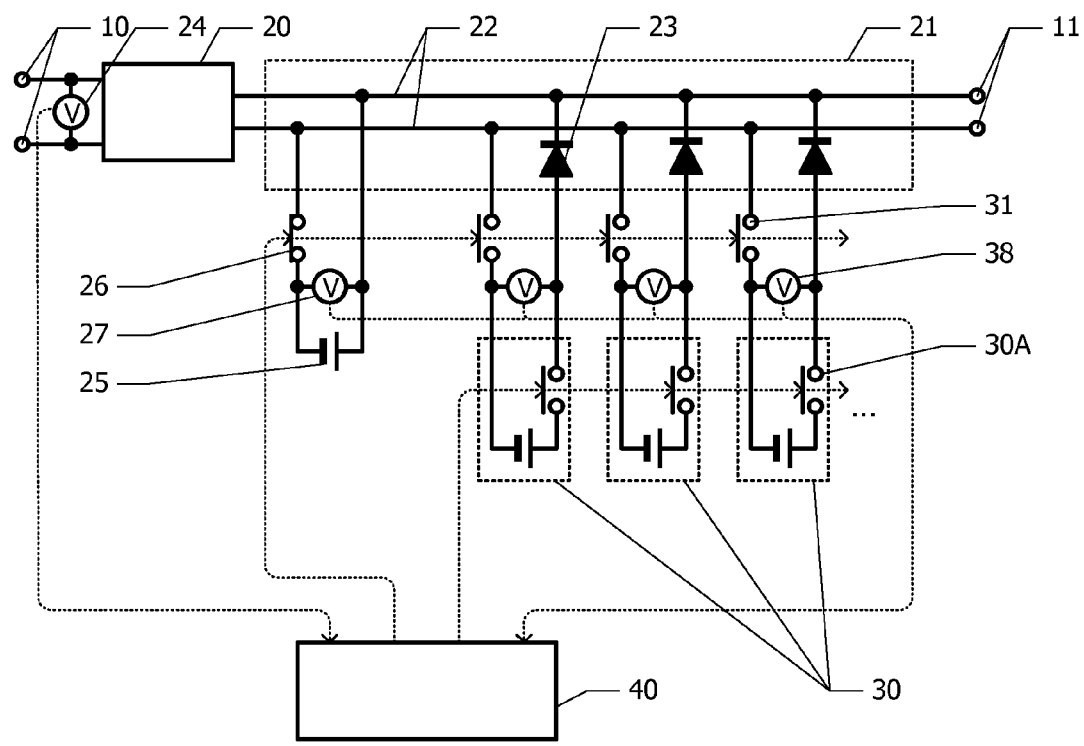
FIG. 3 is an equivalent circuit diagram of the power supply device according to one embodiment.

FIG. 3 illustrates an equivalent circuit diagram of the power supply device according to the embodiment. A voltmeter 24 measures the voltage of the commercial power source (refer to FIG. 1), which is applied to the input terminal 10. The measured result of the voltmeter 24 is input to the controller 40. The controller 40 monitors a measurement value of the voltmeter 24 (voltage of the commercial power source 12, which is applied to the input terminal 10). The controller 40 compares the measurement value of the voltmeter 24 with a specified voltage value, and determines that normal power supply from the commercial power source 12 (refer to FIG. 1) is stopped, if the measurement value of the voltmeter 24 falls to the specified voltage value or less.

The electric power transmission circuit 21 includes a bus line 22 and diodes 23. Input and output terminals of the power storage device 25 are connected to the bus line 22 via the switching element 26. A voltmeter 27 measures the voltage across the input and output terminals of the power storage device 25. The measured result of the voltmeter 27 is input to the controller 40. As long as there is no special circumstance, the switching element 26 is switched on at all times. Therefore, the voltage measured by the voltmeter 27 is equal to the voltage applied to the bus line 22.

The multiple primary batteries 30 are connected to the bus line 22 so as to be in parallel with one another via the respectively associated switching elements 31, and so as to be in parallel with the power storage device 25. The diode 23 is arranged for each of primary batteries 30, and is connected to the primary battery 30 in series. The diode 23 is connected such that the direction of the discharging current from the primary battery 30 corresponds to the forward direction. For this reason, a charged current is prohibited from flowing into the primary battery 30. When the potential of the positive electrode of the primary battery 30 becomes lower than the potential of the bus line 22, a control for preventing the inflow of the charged current may be performed by switching off the switching element 31. In a case of performing this control, the diodes 23 may be omitted.

Multiple voltmeters 38 measure the voltages across the output terminals of the respective primary batteries 30. The measured result is input to the controller 40. A switch 30A indicated within a dashed line illustrating the primary battery 30 represents that the primary battery 30 has two states of the standby state and the operation state. The off-state and the on-state of the switch 30A respectively correspond to the standby state and the operation state.

The power storage device 25 outputs a required voltage by connecting the lead storage batteries to one another in series, the number of which corresponds to the required voltage for the electric load 13. The primary battery 30 has a configuration where multiple zinc-air batteries are connected to one another in series such that an open circuit voltage thereof is slightly higher than the open circuit voltage of the power storage device 25.

The distance from the output terminal 11 to a position on the bus line 22 to which each of the multiple primary batteries 30 is connected is shorter than the distance from the output terminal 11 to a position on the bus line 22 to which the power storage device 25 is connected. When the electric power is supplied from the primary battery 30 to the electric load 13 (refer to FIG. 1), it is possible to reduce the effect of resistance on the bus line 22 by shortening the distance from the primary battery 30 to the output terminal 11.

Referring to FIGS. 4 to 8, an operation of a power supply circuit according to the embodiment will be described.

Figure 4:
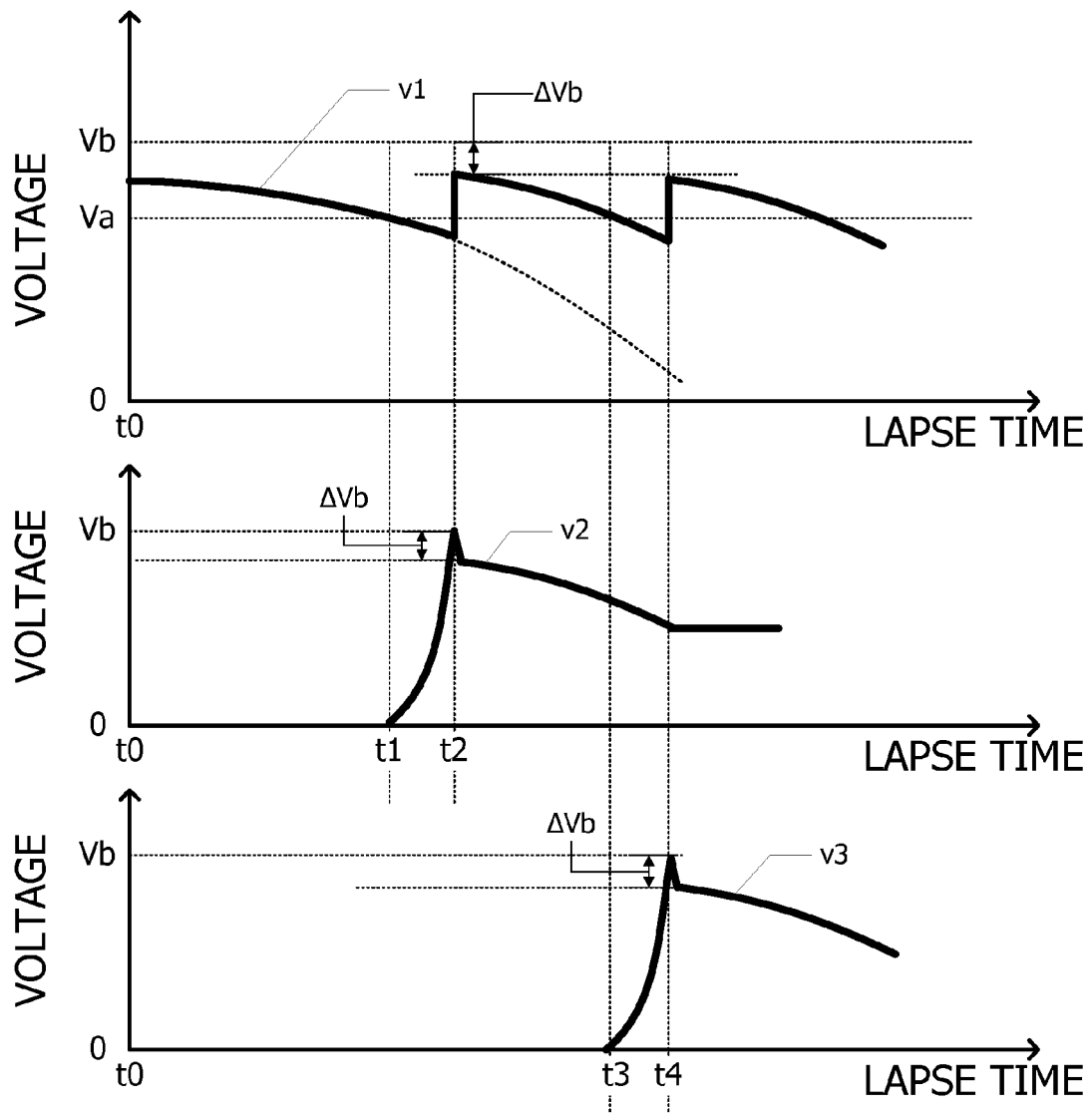
FIG. 4 is a graph illustrating a change in a voltage during backup of the power supply device according to one embodiment.

FIG. 4 illustrates an example of time changes in the voltage of the bus line 22 (refer to FIG. 3) and the voltages across the terminals of the primary battery 30 (refer to FIG. 1). In FIG. 4, a solid line of a voltage v1 in the upper row represents the voltage of the bus line 22 (refer to FIG. 3), a solid line of a voltage v2 in the middle row represents the voltage across the terminals of the primary battery 30 (refer to FIG. 1) to be firstly operated, and a solid line of a voltage v3 in the lower row represents the voltage across the terminals of the primary battery 30 (refer to FIG. 1) to be secondly operated. Since the switching element 26 (refer to FIG. 3) is the on-state at all times, the voltage v1 of the bus line 22 can be measured by the voltmeter 27 (refer to FIG. 3).

Figure 5:
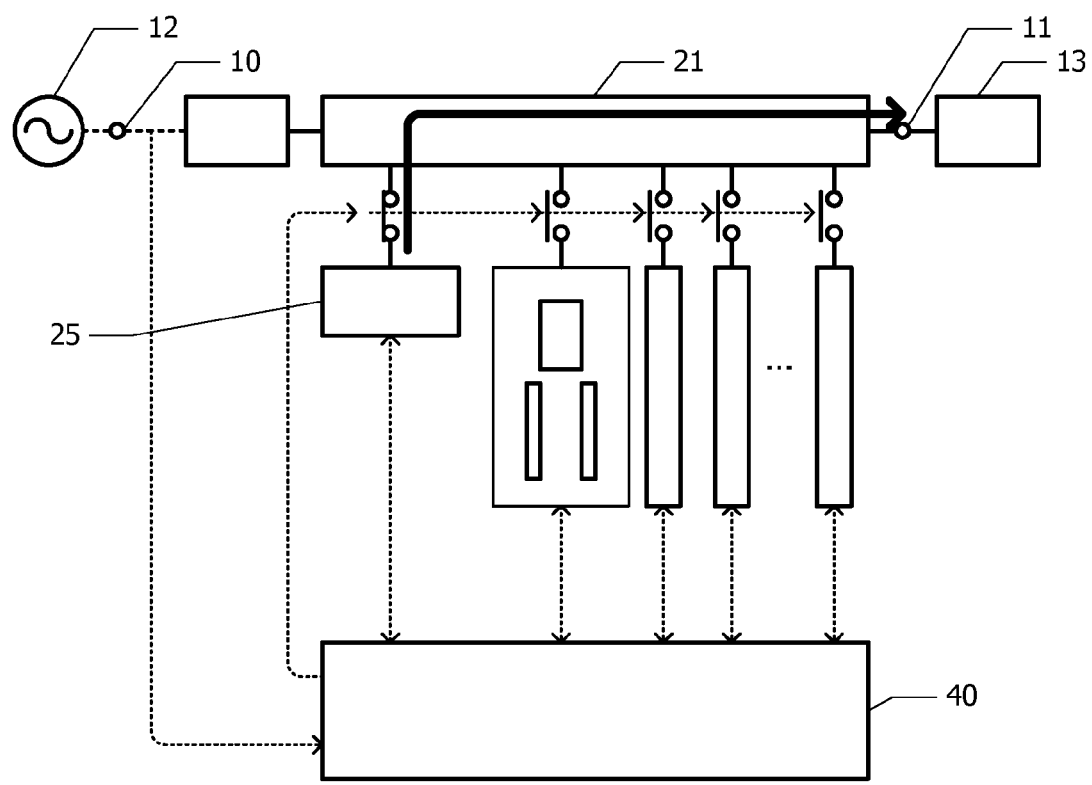
FIG. 5 is a block diagram during the backup of the power supply device according to one embodiment.

At time t0, the power supply from the commercial power source 12 (refer to FIG. 1) is assumed to be stopped. The measurement value of the voltmeter 24 (refer to FIG. 3) falls to a specified voltage value or less. Accordingly, the controller 40 detects that the power supply is stopped from the commercial power source 12. At the time t0, as illustrated in FIG. 5, the discharge from the power storage device 25 is started, and the electric power is supplied to the electric load via the electric power transmission circuit 21. As illustrated in FIG. 4, the voltage v1 across the terminals of the power storage device 25 is lowered with the lapse of time by electric discharge of the power storage device 25.

At time t1 illustrated in FIG. 4, the voltage v1 of the bus line 22 (refer to FIG. 3) is lowered to a voltage threshold value Va. If the controller 40 (refer to FIG. 1) detects that the voltage v1 of the bus line 22 (refer to FIG. 3) is lowered to the voltage threshold value Va, the controller 40 turns on the on-off valve 52 (refer to FIG. 2) of the primary battery 30 to be firstly operated. The electrolytic solution is injected to the primary battery 30, and the voltage v2 across the terminals of the primary battery 30 starts to rise. When the discharged current of the power storage device 25 is within a range of a rated value, the voltage across the terminals of the power storage device 25 corresponds to a state of charge (SOC) of the power storage device 25. Accordingly, monitoring the voltage v1 of the bus line 22 (refer to FIG. 3) is substantially equivalent to monitoring the SOC of the power storage device 25.

At time t2, the voltage v2 across the terminals of the primary battery 30 to which the electrolytic solution is injected reaches a rated open circuit voltage Vb. When the controller 40 (refer to FIG. 1) detects that the voltage v2 across the terminals reaches the rated open circuit voltage Vb, the switching element 31 (refer to FIG. 1) connected to the primary battery 30 to which the electrolytic solution is injected is switched on. In the result, the primary battery 30 changes from the standby state to the operation state. The discharged current starts to flow from the primary battery 30, and thus the voltage v1 of the bus line 22 (refer to FIG. 3) rises. Since voltage drop $\Delta Vb$ occurs due to the internal resistance of the primary battery 30, the voltage v1 of the bus line 22 (refer to FIG. 3) rises to Vb-$\Delta Vb$.

Figure 6:
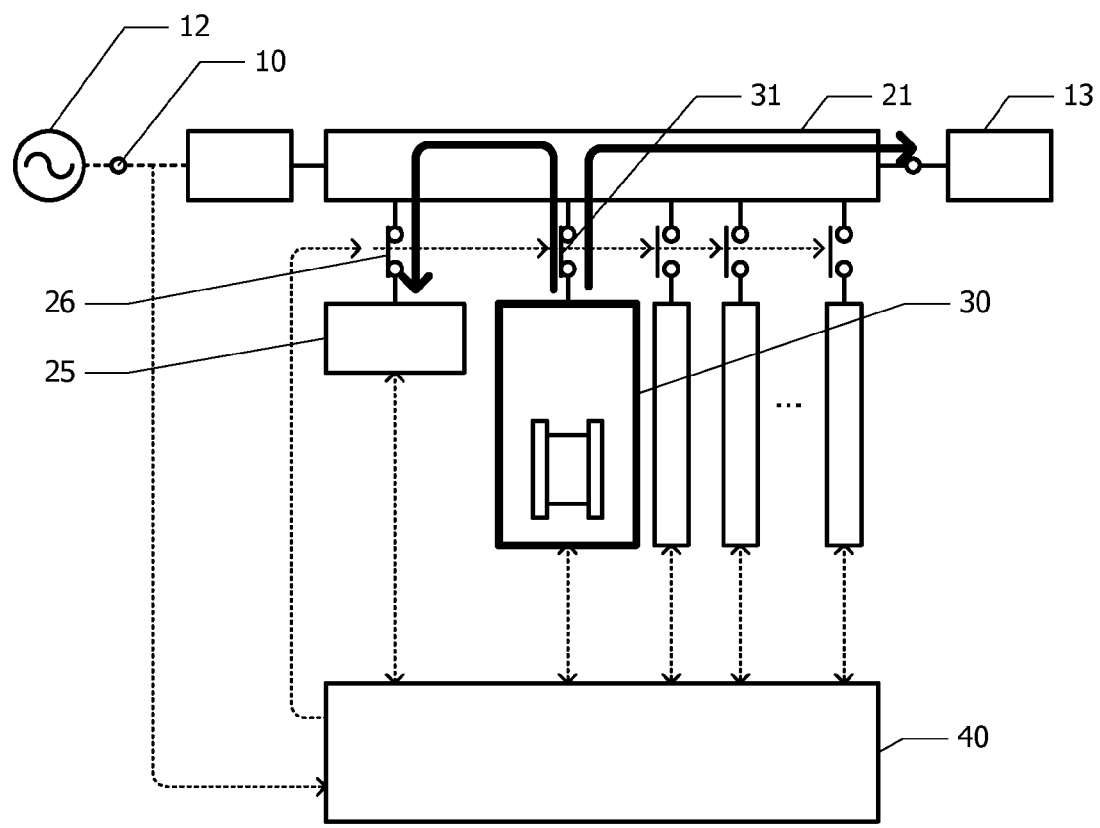
FIG. 6 is a block diagram during the backup of the power supply device according to one embodiment.
Figure 7:
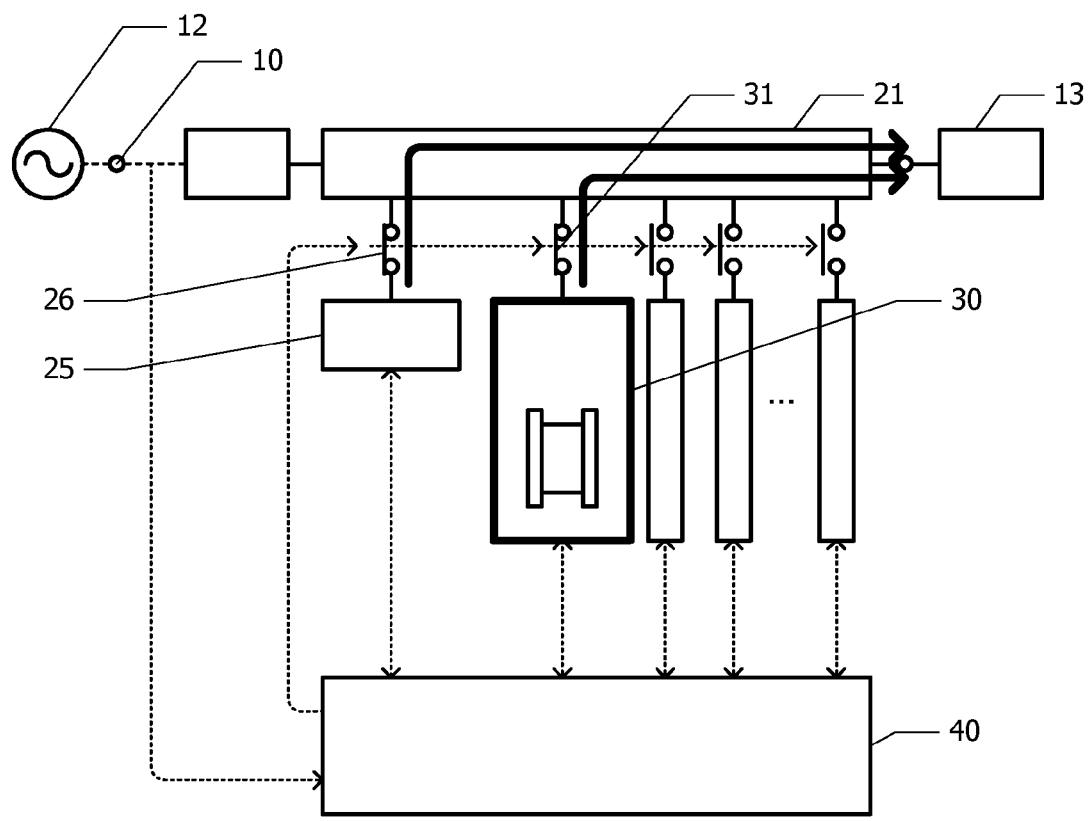
FIG. 7 is a block diagram during the backup of the power supply device according to one embodiment.

As illustrated in FIG. 6, the electric power is supplied from the primary battery 30 in the operation state to the electric load 13. If the voltage v1 of the bus line 22 (refer to FIG. 3) is higher than the open circuit voltage across the terminals of the power storage device 25, that is, if the potential of the bus line 22 (refer to FIG. 3) is higher than the potential of the positive electrode of the power storage device 25, the power storage device 25 is charged by using the discharge power from the primary battery 30 in the operation state. If the power consumption increases in the electric load 13, the discharge current increases in the primary battery 30. As a result, the voltage drop due to the internal resistance of the primary battery 30 increases, and thus the voltage v1 of the bus line 22 is lowered. If the voltage v1 of the bus line 22 (refer to FIG. 3) is lower than the open circuit voltage across the terminals of the power storage device 25, as illustrated in FIG. 7, the power storage device 25 discharges the electricity. Therefore, the electric power is supplied to the electric load 13 from both of the primary battery 30 and the power storage device 25. The charging and discharging of the power storage device 25 are performed according to the power consumption of the electric load 13. As a whole, the voltage v1 of the bus line 22 is lowered with the lapse of time. A sudden change in the power consumption, which is caused by the electric load 13, also switches between charging and discharging of the power storage device 25.

At time t3 in FIG. 4, the voltage v1 of the bus line 22 is lowered to a voltage threshold value Va, and the controller 40 (refer to FIG. 1) starts to inject the electrolytic solution to the primary battery 30 to be secondly operated. Accordingly, the voltage v3 across the terminals of the primary battery 30 secondly operated rises. When the voltage v3 across the terminals reaches the rated open circuit voltage Vb, the controller 40 (refer to FIG. 1) switches on the switching element 31 (refer to FIG. 1) connected to the primary battery 30 to be secondly operated, and switches off the switching element 31 (refer to FIG. 1) connected to the primary battery 30 firstly operated. Since the discharge current from the primary battery 30 firstly operated no longer flows, the voltage v2 across the terminals of the primary battery 30 maintains a substantially constant value.

Figure 8:
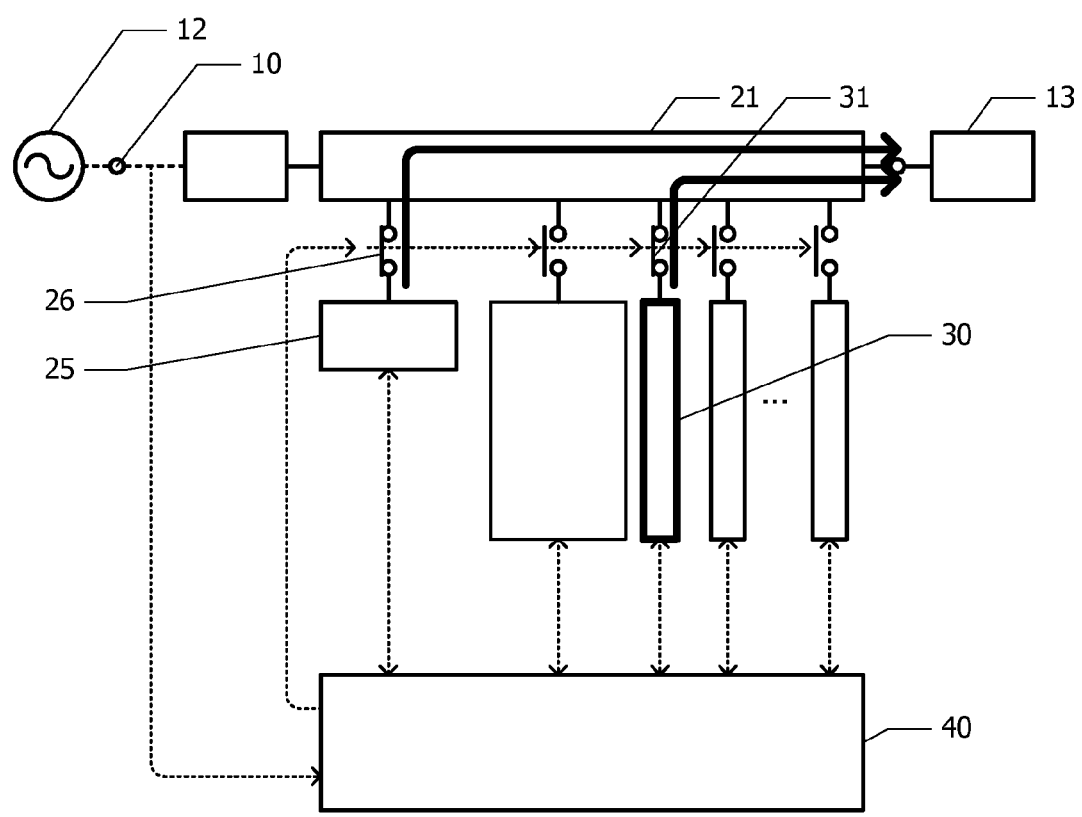
FIG. 8 is a block diagram during the backup of the power supply device according to one embodiment.

As illustrated in FIG. 8, after time t4, the primary battery 30 secondly operated discharges electricity. The charging and discharging of the power storage device 25 are performed according to the power consumption of the electric load 13. Even after the time t4, every time the voltage v1 of the bus line 22 (refer to FIG. 3) is lowered to the voltage threshold value Va, the injecting the electrolytic solution to the primary battery 30 to be subsequently operated is started. This enables the electric power to be successively supplied to the electric load 13.

In the embodiment described above, during the period of the standby state of the primary battery 30 (refer to FIG. 1), the negative electrode active material 34 (refer to FIG. 2) and the electrolytic solution are not in contact with each other. Therefore, it is possible to prevent self-discharge and the deterioration of the battery. During the period (time t0 to t2 in FIG. 4) until when the electrolytic solution is injected to the primary battery 30 to generate the rated voltage, the electric power is supplied from the power storage device 25 to the electric load 13. Therefore, the power supply is continuously guaranteed.

As described above, the controller 40 monitors the voltage of the commercial power source, which is applied to the input terminal 10, and the SOC of the power storage device 25, and based on the monitored result, supplies the output terminal 11 with the output of at least one primary battery out of the multiple primary batteries 30. More specifically, the controller 40 supplies the output terminal 11 with the output of at least one primary battery out of the multiple primary batteries 30, using detection of at least one event as a trigger, between the event that the voltage of the commercial power source, which is applied to the input terminal 10, falls to the specified voltage value or less and the event that the SOC of the power storage device 25 falls to the preset specified value or less.

It is only necessary to set the capacity of the power storage device 25 to such a degree that the electric power can be supplied to the electric load 13 during the period until the primary battery 30 starts to be operated. Therefore, compared to a case of the backup using only the power storage device 25, it is possible to further decrease the capacity thereof. If the capacity of the power storage device 25 is decreased, the power consumption caused by the self-discharge of the power storage device 25 is decreased. Therefore, even if the power storage device 25 maintains the fully charged state, it is possible to reduce a power loss caused by the self-discharge.

The embodiment described above, as a trigger for operating the primary battery 30 (refer to FIG. 1), adopts the monitored result (voltage v1 in FIG. 4) of the SOC of the power storage device 25 (refer to FIG. 1). As a trigger for firstly operating the primary battery 30, the monitored result of the voltage of the commercial power source, which is applied to the input terminal 10, may be adopted. For example, the on-off valve 52 (refer to FIG. 2) of the primary battery 30 to be firstly operated may be turned on after a lapse of the preset time for standby from when the controller 40 detects that the voltage of the commercial power source, which is applied to the input terminal 10, falls to the specified voltage value or less. The time for standby is determined based on the available time for the power storage device 25 to supply the sufficient electric power to the electric load 13 (refer to FIG. 1).

Furthermore, as a trigger for operating the primary battery 30 (refer to FIG. 1), both of the monitored result of the SOC of the power storage device 25 (refer to FIG. 1) and the monitored result of the voltage of the commercial power source, which is applied to the input terminal 10, may be adopted.

Figure 9:
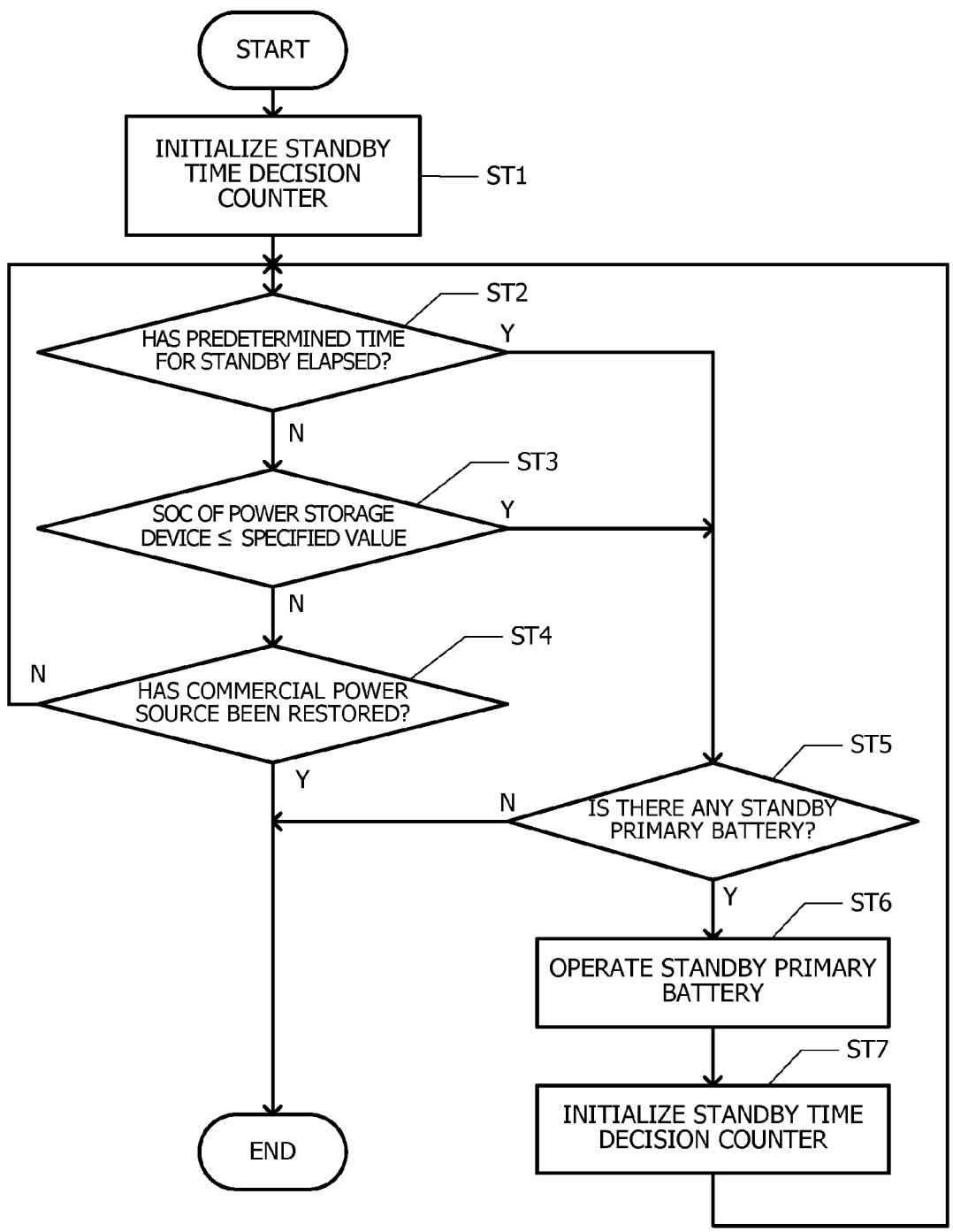
FIG. 9 is a flowchart of determining a trigger for operating the primary battery of the power supply device according to one embodiment.

FIG. 9 illustrates an example of a flowchart in a process performed by the controller 40 in a case where both of the monitored result of the SOC of the power storage device 25 and the monitored result of the voltage of the commercial power source, which is applied to the input terminal 10, are adopted as the trigger for operating the primary battery 30. The process in this flowchart starts from when the controller 40 detects that the voltage of the commercial power source falls to the specified voltage value or less.

If it is detected that the voltage of the commercial power source falls to the specified voltage value or less, a standby time decision counter is initialized in Step ST1. The initialized counter is decremented with the lapse of time and becomes zero when the time for standby elapses. In Step ST2, it is determined whether or not predetermined time for standby has elapsed. Specifically, it is determined whether or not the standby time decision counter has been decremented to become zero. If the predetermined time for standby has not yet elapsed, it is determined whether the SOC of the power storage device 25 (refer to FIG. 1) is equal to or less than the specified value in Step ST3. If it is beyond the specified value, in Step ST4, it is determined whether or not the voltage of the commercial power source has been restored to have the specified voltage value. If the voltage of the commercial power source has been restored, the process ends. If the voltage of the commercial power source has not yet been restored, the process returns to Step ST2.

In Step ST2, if it is determined that the predetermined time for standby has elapsed, or in Step ST3, if it is determined that the SOC of the power storage device 25 is equal to or less than the specified value (corresponding to time t1 and t3 in FIG. 4), in Step ST5, it is determined whether or not the standby primary battery 30 still remains. If the standby primary battery 30 does not remain, the process ends. If the standby primary battery 30 still remains, in Step ST6, the standby primary battery 30 is started to be operated.

The process in Step ST6 is the same as the process from the time t1 to t2 in FIG. 4. That is, the on-off valve 52 (refer to FIG. 2) of the primary battery 30 to be operated is turned on. If the open circuit voltage of the primary battery 30 rises up to the rated voltage value, the switching element 31 is switched on.

Then, in Step ST7, the standby time decision counter is initialized, and the decrement process of the counter resumes. After initializing the standby time decision counter, the process returns to Step ST2. The initial value of the time for standby set in Step ST1 is not always the same as the initial value of the time for standby set in Step ST7. The initial value of the time for standby set in Step ST1 may be set to such a value that the fully charged power storage device 25 can supply the sufficient electric power to the electric load 13 (refer to FIG. 1). The initial value of the time for standby set in Step ST7 may be set to such a value that the primary battery 30 can supply the sufficient electric power to the electric load 13 (refer to FIG. 1).

Figure 10:
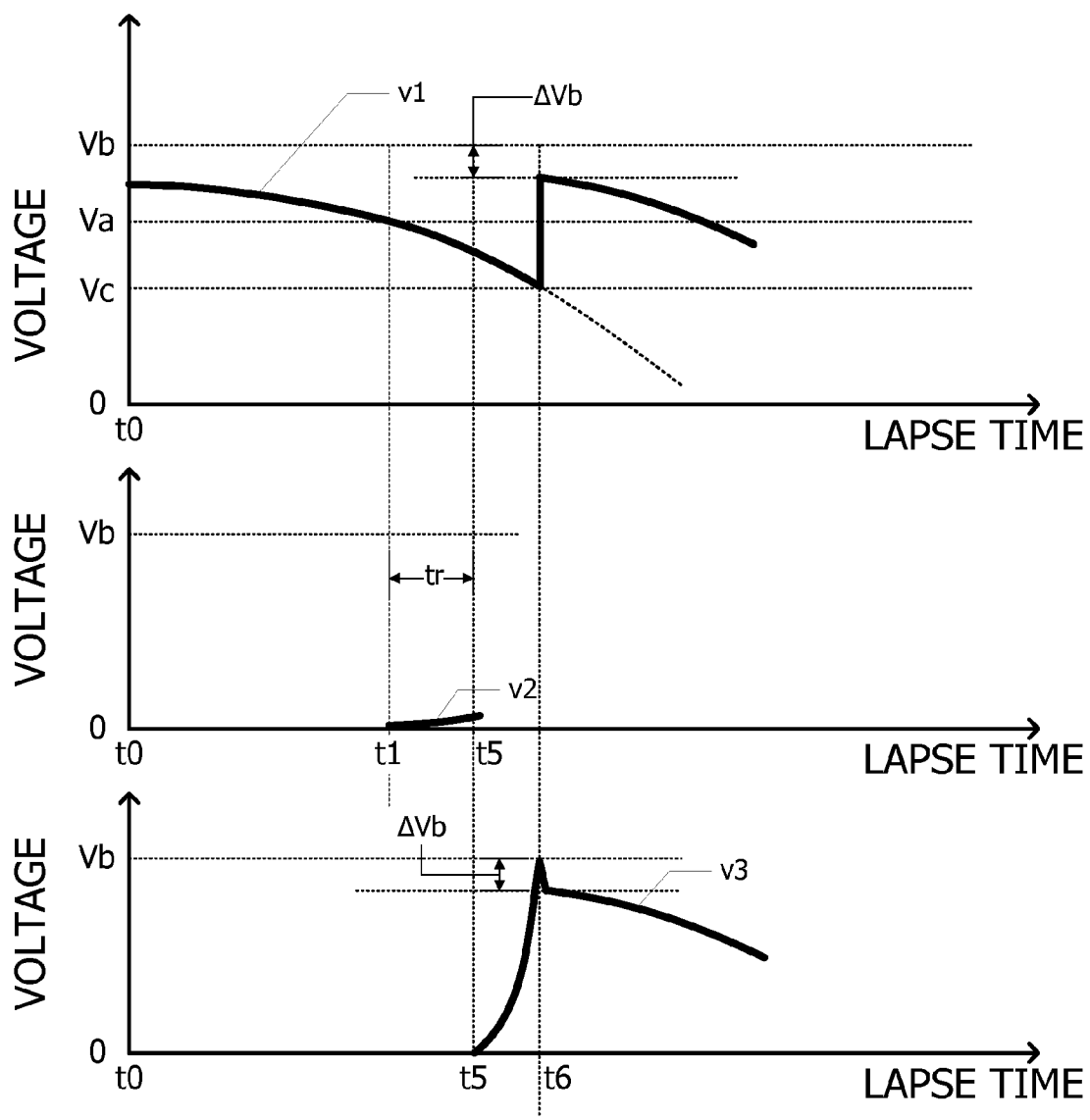
FIG. 10 is a graph illustrating a change in a voltage when there is abnormality in the primary battery during the backup of the power supply device according to one embodiment.

Referring to FIG. 10, a control in a case where an operation of the operated primary battery 30 is poor will be described.

FIG. 10 illustrates an example of time changes in the voltage of the bus line 22 (refer to FIG. 3) and the voltage across the terminals of the primary battery 30 (refer to FIG. 1). Hereinafter, different points from the time changes illustrated in FIG. 4 will be described. At the time t1, the primary battery 30 is changed to the operation state by turning on the on-off valve 52 (refer to FIG. 2) of the primary battery to be firstly operated. As illustrated in the second row in FIG. 10, this process allows the voltage v2 across the terminals of the primary battery 30 to be firstly operated to start to rise. However, since there is a certain abnormality in the primary battery 30, as compared to the case in FIG. 4, the rising rate of the voltage v2 across the terminals is slow. The primary battery 30 corresponding to the on-off valve 52 (refer to FIG. 2) that is turned on is changed to the operation state for enabling the output of the electric power. Even if a certain abnormality causes the electrolytic solution not to be injected to a space containing the negative electrode active material 34, and thus the electromotive force is not generated, the state of the primary battery 30 corresponding to the on-off valve 52 opened is referred to as the "operation state".

Even if monitoring time tr has elapsed from the time t1, the voltage v2 across the terminals of the operated primary battery 30 does not reach the rated open circuit voltage Vb. The controller 40 monitors whether the operation of the operated primary battery 30 is good or poor. The controller 40, when detecting that at the time t5 when the monitoring time tr has elapsed from the time t1, the voltage v2 across the terminals does not reach the rated open circuit voltage Vb, determines that the primary battery 30 is poorly operated. If the operated primary battery 30 is determined to be poorly operated, the controller 40 turns on the on-off valve 52 (refer to FIG. 2) of the primary battery 30 to be subsequently operated.

As illustrated in the third row in FIG. 10, the voltage v3 across the terminals of the primary battery 30 to be subsequently operated starts to rise. At time t6, the voltage v3 across the terminals reaches the rated open circuit voltage Vb. The controller 40, when detecting that the voltage v3 across the terminals has reached the rated open circuit voltage Vb, switches on the switching element 31 (refer to FIG. 1) connected to the primary battery 30 which has reached the rated open circuit voltage Vb. The voltage v3 across the terminals of the primary battery 30 is lowered by the voltage drop $\Delta Vb$ caused by the internal resistance. The voltage v1 of the bus line 22 (refer to FIG. 3) is lowered to a voltage Vc which is lower than the voltage threshold value Va, during the time until time 6. When the switching element 31 of the operated primary battery 30 is switched on, the voltage v1 of the bus line 22 is restored to $Vb-\Delta Vb$.

After the time t6, the electric power is supplied from the secondly operated primary battery 30 to the electric load 13 (refer to FIG. 1). If the voltage v1 of the bus line 22 is lowered to the voltage threshold value Va, the controller 40 turns on the on-off valve 52 (refer to FIG. 2) of the primary battery 30 to be subsequently operated.

When one primary battery 30 is poorly operated, it is possible to suppress the voltage v1 of the bus line 22 (refer to FIG. 3) from being excessively lowered by changing the state of the other primary battery 30 to the operation state.

Figure 11:
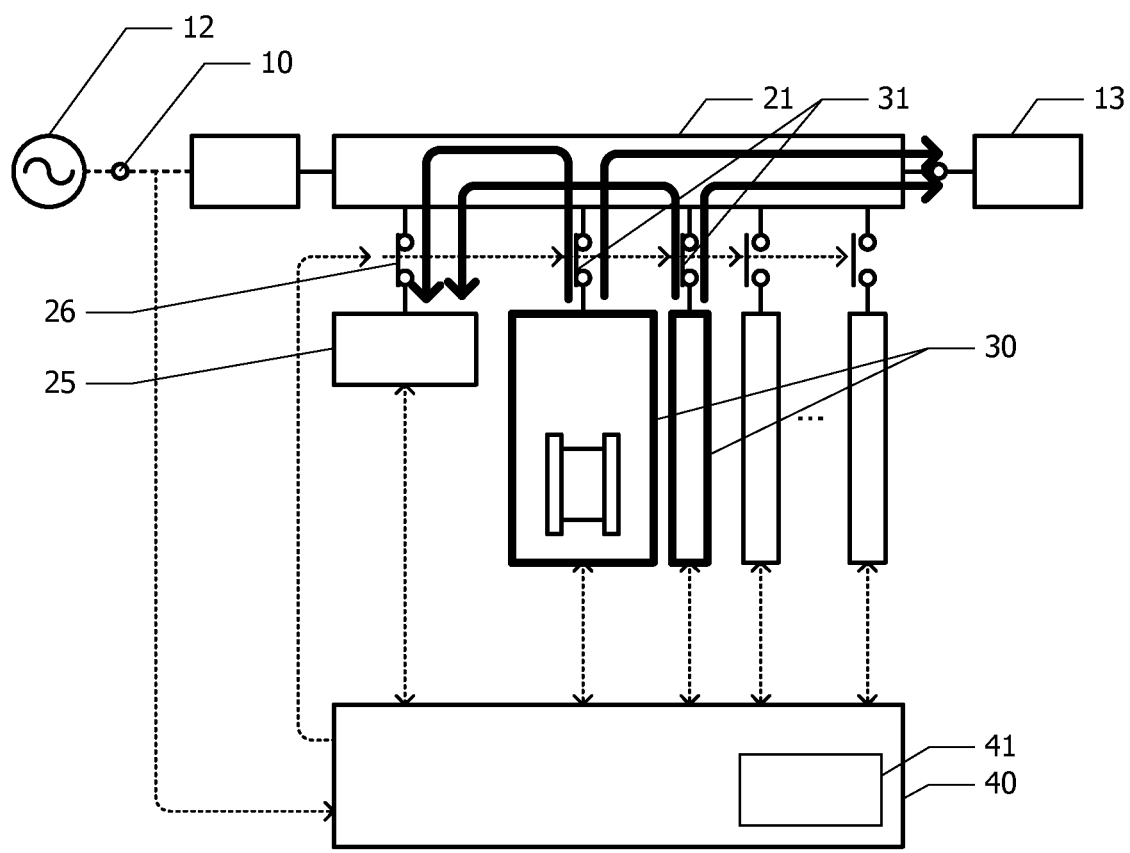
FIG. 11 is a block diagram during backup of a power supply device according to a modification example of one embodiment.

FIG. 11 illustrates a block diagram during a backup operation of the power supply device according to a modification example of the embodiment illustrated in FIGS. 1 to 10. In the embodiment, as illustrated in FIG. 6, when the power supply is stopped from the commercial power source 12, the states of the primary batteries 30 are changed to the operation states sequentially and one by one. In the modification example illustrated in FIG. 11, the states of multiple primary batteries 30 are simultaneously changed to the operation state. FIG. 11 illustrates an example where two primary batteries 30 are simultaneously left in the operation state.

The number of the primary batteries 30 to be simultaneously operated is decided depending on the electric power required by the electric load 13. It is possible to supply the sufficient electric power to the electric load 13 by simultaneously operating the multiple primary batteries 30. The number of the primary batteries 30 to be simultaneously operated is stored in a storage device 41 inside the controller 40. The electric power required by the electric load 13 varies for each radio base station, for example. The power supply device according to the modification example can set a value which is to be stored in the storage device 41 for each radio base station. Accordingly, the power supply device can be applied to various scales of the radio base station.

When simultaneously operating the multiple primary batteries 30, the controller 40 independently monitors each voltage across the terminals of the operated primary batteries 30. When determining that at least one primary battery 30 out of the operated primary batteries 30 is poorly operated, the controller 40 changes the states of the same number of the other primary batteries 30 as the number of the primary batteries 30 determined to be poorly operated, to the operation states. This can suppress the voltage v1 of the bus line 22 (refer to FIG. 3) from being excessively lowered.

Figure 12:
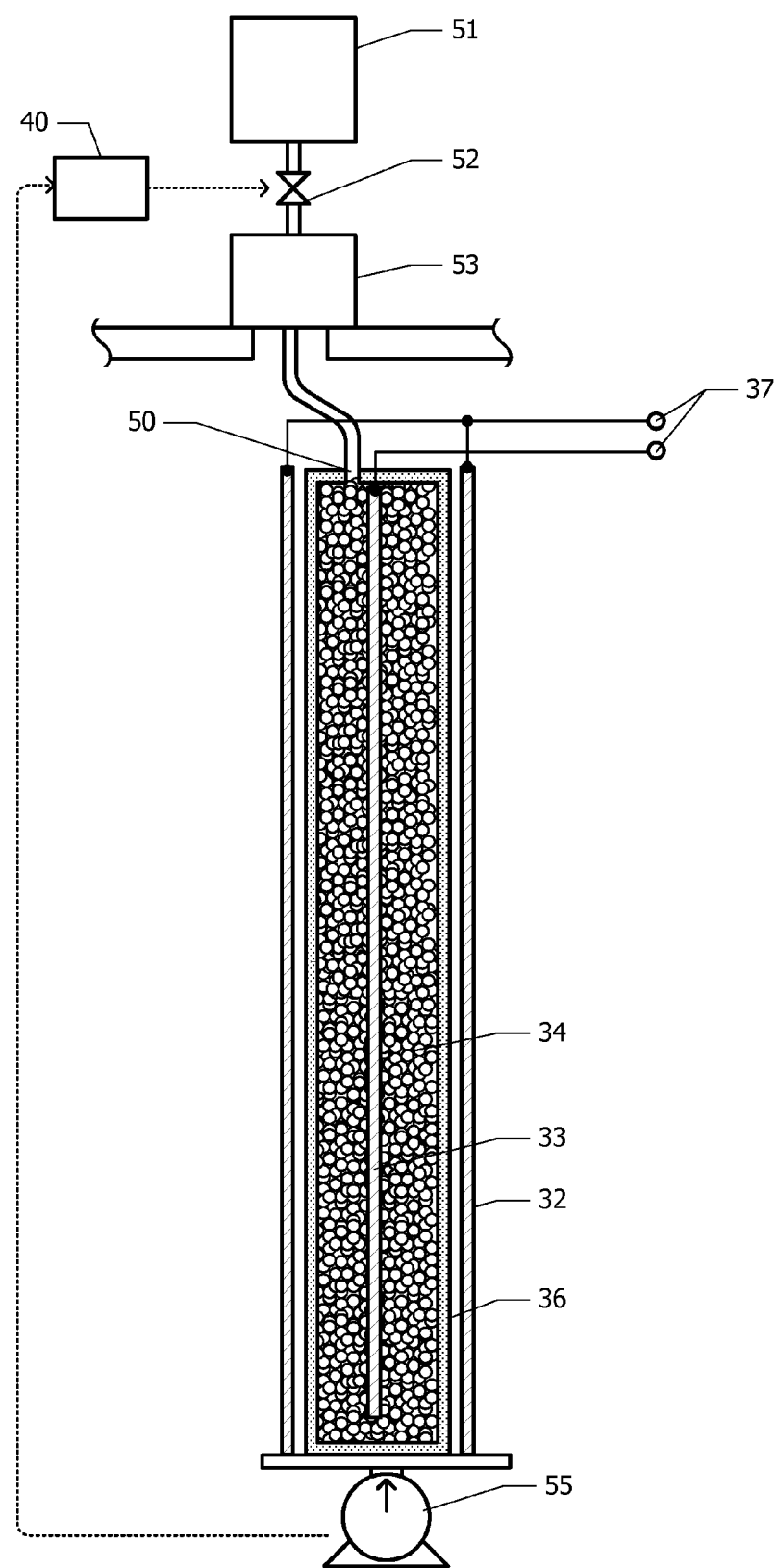
FIG. 12 is a cross-sectional view illustrating a primary battery used in a power supply device according to another embodiment.

FIG. 12 illustrates a schematic diagram of a primary battery according to another embodiment. Hereinafter, different points from the embodiment illustrated in FIG. 2 will be described, and the same configurations will not be repeatedly described. A gravimeter 55 measures weights of the positive electrode current collector 32, the negative electrode current collector 33, the negative electrode active material 34 and the separator 36. Since the reservoir tank 51, the on-off valve 52 and the electrolyte containing chamber 53 are fixed to a base, the weights thereof are not measured by the gravimeter 55. The measured result is input to the controller 40. If the electrolytic solution is injected into the separator 36, the weights measured by the gravimeter 55 are increased. It is possible to estimate an injection amount of the electrolytic solution by checking the increase in weight. The controller stores a tendency of the increase in weight when the electrolytic solution is normally injected into the separator 36. By comparing the tendency of the increase in the weight measured by the gravimeter 55 with the tendency of the increase in the normal weight stored in advance, it is possible to detect whether or not the injection of the electrolytic solution is normally performed.

The controller 40 monitors the result measured by the gravimeter 55 after the time t1 illustrated in FIG. 10. When the tendency of the increase in the weight measured by the gravimeter 55 departs from a normal range, the controller 40 determines that the electrolytic solution is not normally injected into the separator 36.

Figure 13:
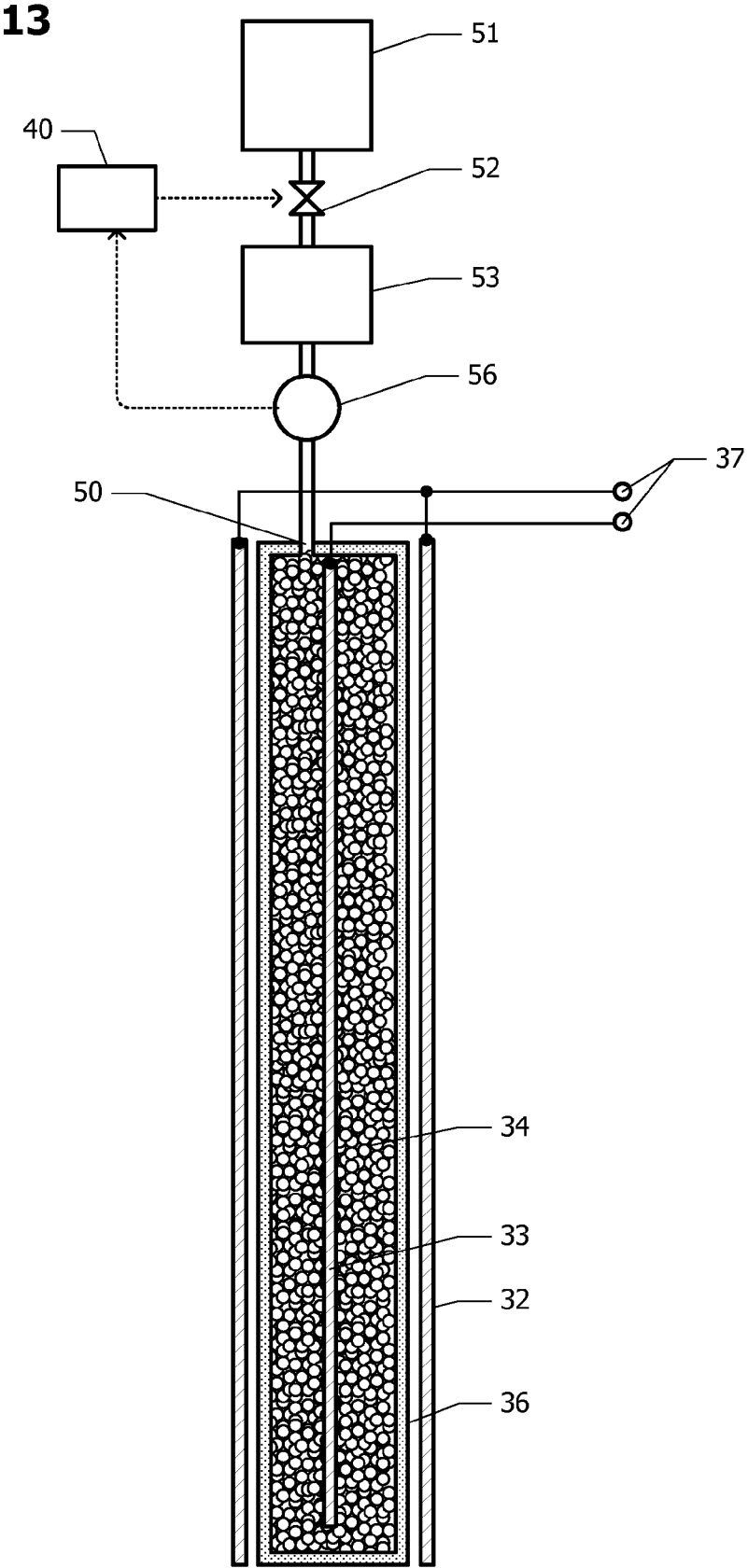
FIG. 13 is a cross-sectional view illustrating a primary battery used in a power supply device according to a modification example of the embodiment illustrated in FIG. 12.

As illustrated in FIG. 13, instead of measuring the weight by using the gravimeter 55, a current meter 56 may be inserted to an injection route of the electrolytic solution. The measured result of the current meter 56 is input to the controller 40. By measuring a flow rate of the electrolytic solution by the current meter 56, it is possible to determine whether or not the electrolytic solution is normally injected into the separator 36.

As described above, by monitoring an injection state of the electrolytic solution using the gravimeter 55, the current meter 56 or the like, it is possible to determine whether the operation of the operated primary battery 30 is good or poor. The determination method adopted in the embodiment described in FIGS. 1 to 10, as to whether the operation is good or poor, based on the voltage across the terminals of the primary battery 30 may be used in conjunction with the determination method adopted in the embodiment illustrated in FIG. 12, as to whether the operation is good or poor, based on the injection state of the electrolytic solution.

Next, a power supply device according to still another embodiment will be described. The block diagram of the power supply device according to this embodiment is the same as the block diagram of the power supply device according to the embodiment illustrated in FIG. 1. In the embodiment illustrated in FIG. 1, the power storage device 25 maintains the fully charge state for the period when the electric power is supplied from the commercial power source 12, but it is not necessarily to maintain the fully charged state. The power storage device 25 may store an electrical energy required during a period until the primary battery 30 starts to be operated when a power failure occurs.

In the embodiment illustrated in FIG. 1, as the power storage device 25, a small capacity device is adopted, which can store the electrical energy required during the period until the primary battery 30 starts to be operated when the power failure occurs. The power storage device 25 adopted to still another embodiment has a larger capacity than the capacity of the power storage device 25 adopted to the embodiment illustrated in FIG. 1. Therefore, without a need to maintain the fully charged state of the power storage device 25, it is possible to store the sufficient electrical energy.

The controller 40 monitors the state of charge (SOC) of the power storage device 25, and charges the power storage device 25 by switching on the switching element 26, if the state of charge is lower than a reference value. If the state of charge is restored to the reference value or more, the controller 40 switches off the switching element 26. In this manner, the controller 40 controls the charging of the power storage device 25 so as to maintain the state of charge required for the backup.

In still another embodiment, the power storage device 25 which has the larger capacity than the storage device 25 in the embodiment illustrated in FIG. 1 is adopted. However, similarly to the embodiment illustrated in FIG. 1, it is possible to reduce the power consumption caused by the self-discharge by not fully charging the power storage device 25.

Hitherto, while the embodiments of the present invention have been described, the embodiments of the present invention are not intended to be limited thereto. For example, it will be apparent to those skilled in the art that various modifications, improvements and combinations can be made. Additionally, the modifications are included in the scope of the invention.

What is claimed is:

1. A power supply device comprising: an input terminal to which an electric power is supplied from a commercial power source; an output terminal connected to an electric load; an electric power transmission circuit which is connected between the input terminal and the output terminal; a power storage device which is connected to the electric power transmission circuit and is charged by the electric power supplied from the input terminal;
   a metal-air battery which is connected to the electric power transmission circuit and is maintained in a standby state where a material of an electrolytic solution is separated from a negative electrode active material of the metal-air battery; a tank accumulating a material of the electrolytic solution separated from the negative electrode active material, the tank being connected to the metal-air battery via a valve; and a controller which controls the valve to supply the material of the electrolytic solution accumulated in the tank into the metal-air battery when a normal power supply from the commercial power source is stopped,
   wherein the metal-air battery is connected to the electric power transmission circuit via a switching element, and wherein the controller switches on the switching element when the controller detects that the voltage across the terminals of the metal-air battery reaches the rated open circuit voltage after supplying the material of the electrolytic solution into the metal-air battery.

2. The power supply device according to claim 1, wherein the power storage device is maintained to be electrically connected to the electric power transmission circuit even after the material of the electrolytic solution is supplied into the metal-air battery.

3. The power supply device according to claim 1, wherein the material of the electrolytic solution is in contact with the negative electrode active material after the electrolytic solution is supplied into the metal-air battery.

4. The power supply device according to claim 1, further comprising:
   other multiple metal-air batteries in addition to the metal-air battery,
   wherein the controller supplies the material of the electrolytic solution into the metal-air batteries, the number of which depends on the electric power required by the electric load connected to the output terminal.

5. The power supply device according to claim 1, wherein the controller supplies the material of the electrolytic solution into the metal-air battery based on a state of charge of the power storage device.

6. The power supply device according to claim 1, wherein the metal-air battery has a characteristic that a voltage across terminals of the metal-air battery starts to rise after supplying the material of the electrolytic solution into the metal-air battery, and
   wherein a power is supplied to the output terminal before the voltage across the terminals of the metal-air battery reaches a rated open circuit voltage of the metal-air battery.

* * * * *